(12) United States Patent
Bulkes et al.

(10) Patent No.: US 7,397,243 B1
(45) Date of Patent: Jul. 8, 2008

(54) MAGNETIC RESONANCE IMAGING SYSTEM WITH A CLASS-E RADIO FREQUENCY AMPLIFIER HAVING A FEEDBACK CIRCUIT

(75) Inventors: Cherik Bulkes, Sussex, WI (US); Stephen Denker, Mequon, WI (US); Arthur J. Beutler, Greendale, WI (US)

(73) Assignee: Kenergy, Inc., Mequon, WI (US)

( * ) Notice: Subject to any disclaimer, the term of this patent is extended or adjusted under 35 U.S.C. 154(b) by 0 days.

(21) Appl. No.: 11/775,335

(22) Filed: Jul. 10, 2007

Related U.S. Application Data (63) Continuation-in-part of application No. 11/678,226, filed on Feb. 23, 2007.

(51) Int. Cl.
    *G01V 3/00* (2006.01)
(52) U.S. Cl. ..................... 324/314; 324/307
(58) Field of Classification Search ......... 324/300–322; 375/295; 607/57
    See application file for complete search history.

(56) References Cited

U.S. PATENT DOCUMENTS

| | | | |
|---|---|---|---|
| 6,073,050 A * | 6/2000 | Griffith ........................ | 607/57 |
| 6,411,090 B1 | 6/2002 | Boskamp | |
| 6,445,953 B1 | 9/2002 | Bulkes et al. | |
| 6,522,194 B1 | 2/2003 | Pehlke | |
| 6,758,551 B2 | 7/2004 | Tien et al. | |
| 6,864,668 B1 | 3/2005 | McCune et al. | |
| 6,879,852 B1 | 4/2005 | Mueller | |
| 6,889,087 B2 | 5/2005 | Moore | |
| 6,864,755 B2 | 8/2005 | Moore | |
| 7,005,935 B2 | 2/2006 | Moore | |
| 7,023,267 B2 | 4/2006 | Lee et al. | |
| 7,123,664 B2 * | 10/2006 | Matero ........................ | 375/295 |
| 2005/0096702 A1 | 5/2005 | Denker et al. | |
| 2005/0187584 A1 | 8/2005 | Denker et al. | |
| 2006/0217089 A1 | 9/2006 | Snelgrove et al. | |
| 2007/0210867 A1 * | 9/2007 | Bulkes et al. ............... | 330/251 |

FOREIGN PATENT DOCUMENTS

| | | |
|---|---|---|
| EP | 0 105 485 | 4/1984 |
| EP | 0 366 188 | 5/1990 |
| EP | 0 823 639 | 2/1998 |

OTHER PUBLICATIONS

Maguire, Y.G.E; "Microslots: Scalable Electromagnetic Instrumentation;" [online] Sep. 2005; Massachusetts Institute of Technology, Massachusetts, XP-002447244; (Internet: http://dspace.mit.edu/bitstream/1721.1/33677/1/64583917.pdf).

\* cited by examiner

*Primary Examiner*—Brij B Shrivastav
(74) *Attorney, Agent, or Firm*—Quarles & Brady; George E. Haas (57) ABSTRACT

A Class-E amplifier has been adapted for use in the radio frequency section that drives a transmit coil of a magnetic resonance imaging (MRI) system. The Class-E amplifier responds to a radio frequency carrier signal and a control signal by producing a radio frequency excitation signal for driving the transmit coil. The Class-E amplifier includes a pickup coil that senses a signal emitted from the transmit coil and produces a feedback signal that is used to alter the control signal and thereby control production of the radio frequency excitation signal.

21 Claims, 6 Drawing Sheets

FIG. 7A
16-WAY POWER SPLITTER

FIG. 7B
SEGMENT OF A VARIABLE PHASE SHIFTER)

Π NETWORK (180 DEGREE SPLITTER)
FIG. 7C

MAGNETIC RESONANCE IMAGING SYSTEM WITH A CLASS-E RADIO FREQUENCY AMPLIFIER HAVING A FEEDBACK CIRCUIT

CROSS-REFERENCE TO RELATED APPLICATIONS

This application is a continuation-in-part of U.S. patent application Ser. No. 11/678,226 filed Feb. 23, 2007.

STATEMENT REGARDING FEDERALLY SPONSORED RESEARCH OR DEVELOPMENT

Not Applicable

BACKGROUND OF THE INVENTION

1. Field of the Invention

The present invention relates to magnetic resonance imaging (MRI) scanners, which are used for non-invasive imaging of the internal organs of a patient for medical diagnostic purposes, and more particularly to a radio frequency amplifier for use with an MRI scanner.

2. Description of the Related Art

Magnetic Resonance Imaging (MRI) is a well-known procedure based on nuclear magnetic resonance (NMR) principles for obtaining detailed, two and three dimensional images of patients. MRI is well suited for the imaging of soft tissues and is primarily used for diagnosing internal injuries.

Typical MRI systems include a magnet capable of producing an intense, homogenous magnetic field around a patient or portion of the patient; a radio frequency (RF) transmitter and receiver system, including a transmit/receiver RF coil also surrounds a portion of the patient; a magnetic gradient system localizes a portion of the patient; and a computer processing/imaging system, which receives the demodulated signals from the receiver system and processes the signals into interpretable data, such as visual images.

The superconducting magnet is used in conjunction with a magnetic gradient coil assembly, which is sequentially pulsed to create a sequence of controlled gradients in the main magnetic field during an MRI data gathering sequence. The superconducting magnet and the magnetic gradient coil assembly include the radio frequency coil on an inner circumferential side of the magnetic gradient coil assembly. The controlled sequential gradients are effectuated throughout a patient imaging volume (patient bore) which is coupled to at least one MRI RF coil or antenna. The RF coils and an RF shield are typically located between the magnetic gradient coil assembly and the patient bore.

As a part of a typical MRI, RF signals of suitable frequencies are transmitted into the patient bore. Nuclear magnetic resonance responsive RF signals are received from the patient via the RF coils. Information encoded within the frequency and phase parameters of the received RF signals, by the use of an RF circuit, is processed to form visual images. These visual images represent the distribution of NMR nuclei within a cross-section or volume of the patient, within the patient bore.

In modern MRI, the demand for high spatial and temporal resolution necessitates the use of high static magnetic field. Active electric coils are used to drive spatial gradients into the static magnetic field. Enhanced imaging sequences typically demand high amplitude gradient fields, rapid field transitions, and large duty cycles in order to improve resolution and scan time. Unfortunately, these properties also increase the power dissipation and thus cause higher temperatures in the scanner.

Figure 1:
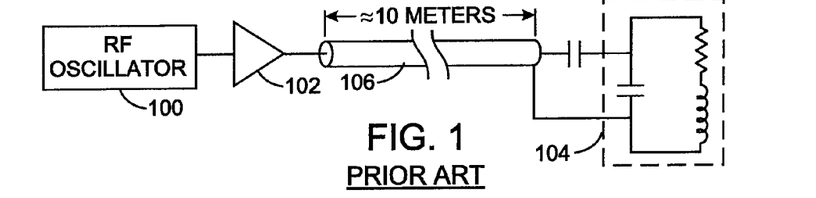
FIG. 1 is a schematic diagram of a conventional connection of a radio frequency amplifier to a transmit coil in an MRI system.

With reference to FIG. 1, the radio frequency transmit signal is produced by an RF oscillator 100 and fed to an RF amplifier 102 that drives a transmit coil 104 located around the patient. The RF oscillator 100 and amplifier 102 usually are located in an equipment cabinet in another room from the patient scanner and connected to the transmit coil 104 by a coaxial cable 106 that often is about ten meters long. Typically, the RF amplifier 102 of choice has been a Class-AB analog amplifier. The class of an analog amplifier defines what proportion of the input signal cycle is used to actually switch on the amplifying device. With a Class-AB amplifier more than 50%, but less than 100%, of the signal cycle that is used to switch on the amplifier. Unfortunately, these amplifiers are not very efficient and produce a significant amount of heat. The efficiency of a power amplifier is defined as the ratio of output power and input power expressed as a percentage and poor efficiency may result in heat production.

Linearity is another important characteristic desired for the RF amplifier. A Class-A amplifier has very good linearity, but this type of amplifier is less than 10% efficient, therefore its power consumption is relatively high. Class-B amplifiers have somewhat worse linearity but are only on half of the time, and rely on the flywheel effect of the resonator to come around. This type of amplifier is, therefore, much more efficient than class A. The disadvantage is linearity, which is decreased to a level that is less desirable. Class-AB amplifiers are in between Classes A and B. Class-C amplifiers are more efficient than Class-B, but have worse linearity. They are on less than half of the signal cycle. Any amplifier that greatly relies on the flywheel effect is required to be close to or right on the resonator for maximum effect.

Recently, a different kind of amplifier, known as a switching amplifier, has been developed. A particularly useful switching amplifier is called a Class-E amplifier. Switching amplifiers have relatively high power efficiency due to the fact that perfect switching operation does not dissipate power. An ideal switch has zero impedance when closed and infinite impedance when open, implying that there is zero voltage across the switch when it conducts current (on state) and a non-zero voltage across it in the non-conductive state (off state). Consequently, the product of voltage and current (power loss) is zero at any time. Therefore, a Class-E amplifier has a theoretical efficiency of 100%, assuming ideal switching.

Although those advantages of Class-E amplifiers could be beneficial for an RF amplifier in a magnetic resonance imaging system, their high non-linearity make conventional amplifiers of this type undesirable for MRI applications.

SUMMARY OF THE INVENTION

The present invention is directed to a version of a Class-E amplifier that is particularly useful in the radio frequency section of a magnetic resonance imaging (MRI) system. The MRI system produces a control signal that defines an intensity for a radio frequency excitation signal which is applied to a transmit coil placed around an object being scanned by the MRI system. The radio frequency excitation signal excites nuclei of atoms in the object.

The radio frequency section includes an exciter that produces a radio frequency carrier signal. The radio frequency carrier signal is manipulated in response to the control signal to produce a radio frequency control signal. The radio frequency control signal controls the Class-E amplifier that generates the radio frequency excitation signal at an output node to which the transmit coil is connected. The Class-E amplifier includes a sensor that detects a radio frequency excitation signal emitted from the transmit coil and produces a feedback signal that the amplifier uses to control generation of the radio frequency excitation signal.

The preferred embodiment of the Class-E amplifier comprises a choke and a switch connected in series between a supply voltage source and circuit ground with the output node formed between choke and the switch. A shunt capacitor coupling the output node to the circuit ground. In addition an input capacitor may be connected between the supply voltage source and the circuit ground.

A transmit coil is connected to the output node of the Class-E amplifier to receive the radio frequency excitation signal. Typically the transmit coil is a volume type, or transverse electromagnetic (TEM) style transmit array, having a plurality of rungs, and a separate Class-E amplifier is connected to drive each rung.

For a volume type transmit coil, a separate Class-E amplifier is connected to drive each rung. In this case, the radio frequency section preferably further comprises a drive circuit and a power splitter. The drive circuit modulates the radio frequency carrier signal using the control signal to produce the radio frequency control signal. The power splitter divides the radio frequency control signal into a plurality of sub-drive signals, one of which for each rung of the transmit coil and each sub-drive signal is employed to drive one of the Class-E amplifiers. In a preferred embodiment, a pair of Class-E amplifiers that are π radians out of phase are connected to each transmit coil rung, and a plurality of phase splitters produce a phase shifted sub-drive signal for each rung. For each rung, a phase-shifted sub-drive signal is applied to one Class-E amplifier and the sub-drive signal is applied to another Class-E amplifier.

DETAILED DESCRIPTION OF THE INVENTION

Figure 2:
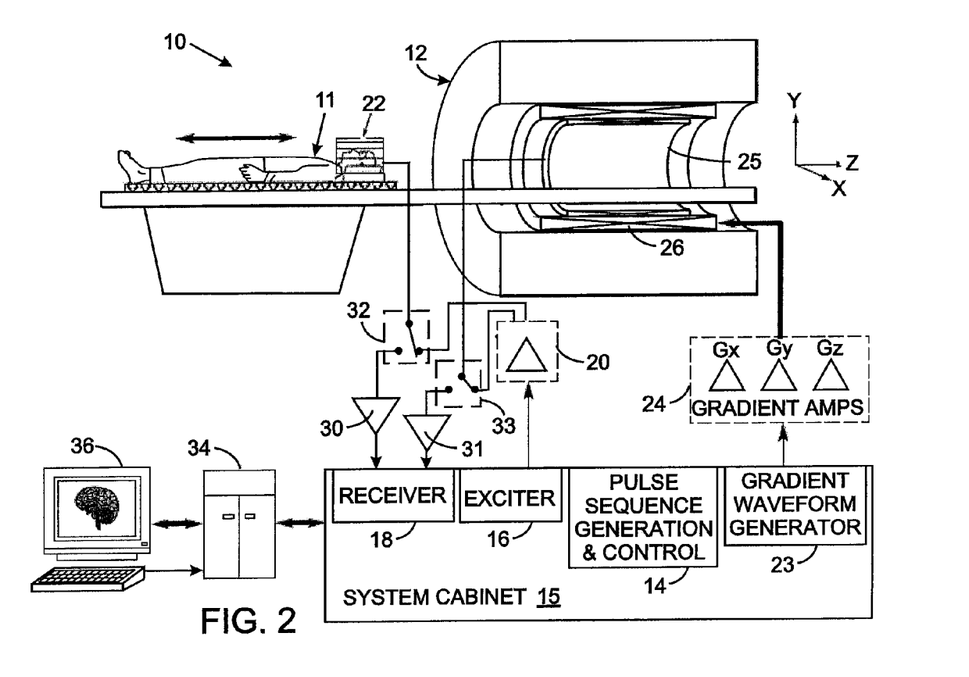
FIG. 2 is a block diagram of an MRI system.

With initial reference to FIG. 2, an imaging scan in an MRI system 10 commences with the patient 11 being prepared by a technologist who is responsible for patient safety and placement of a transmit/receive local coil 22 on the patient. Once the landmark (origin of the scan location) is set and the patient 11 positioned inside the scanner 12, the prescribed protocol is entered into the processor 34. The protocol is a set of parameters for the imaging pulse sequence being prescribed. When the protocol is loaded, the pulse sequence generation and control unit 14 in the system cabinet 15 specifies the magnetic field gradient and radio frequency (RF) waveforms and prepares the system 10 for data acquisition. The X, Y, and Z magnetic field gradient waveforms produced by generator 23 are amplified by the gradient amplifiers 24 (also known as "gradient drivers") and fed to the gradient coils 26 in accordance with the waveforms prescribed by the current protocol.

The RF subsystem comprises transmitter section having an exciter 16 which generates RF waveform pulses that fed through an RF power amplifier 20 and a transmit/receive (T/R) switch 32 to the transmit/receive local coil 22 positioned around the head of the patient 11. A larger transmit/receive coil body 25 located inside the gradient coils 26 alternatively is used for imaging larger regions of the patient. The transmit/receive local coil local or body coils emits a radio frequency excitation signal that excites nuclei of atoms in the patient 11. The required peak power needed to be applied to a transmit/receive coil body for excitation of the spin system is 16 KW for 64 MHz excitation and 35 KW for 128 MHz excitation, for example. Furthermore, the required peak power needed to be applied to a local coil 22 is on the order of 2 kW for 64 MHz excitation and approximately twice that for 128 MHz excitation.

The RF receiver section has a preamplifier 30, which alternately is connected by the T/R switch 32 to the transmit/receive local coil 22. The RF receiver is also connected a preamplifier 31, which alternately is connected by the T/R switch 33 to the transmit/receive body coil 25. The output of the preamplifiers 30 and 31 are applied to a receiver 18 that samples the echo signal, referred to as the free-induction decay (FID) or echo response signal, and those sample are written into the raw data file in memory of the processor 34. Upon completion of the scan, the raw data is reconstructed by a processor 34 to form the final images displayed on the monitor 36.

Focusing on the transmitter section, the RF power amplifier 20 amplifies the modulated MRI excitation signal to a level sufficient to generate the required circularly polarized RF magnetic field (B1). Peak B1 field amplitudes between 15 μT and 30 μT inside a transmit/receive body coil 25 require a peak power of 15 to 20 kW in a typical 1.5 T whole-body MRI system. The RF power requirement is proportional to the square of the RF B field magnitude. This becomes a very important consideration for higher field strengths (e.g. 3 T) whole-body MRI systems. The RF power amplifier 20 may also amplify the modulated MRI excitation signal to a local coil such 22, such as a head coil, which may require a peak power of 2 kW in a typical 1.5T system and twice that power for a 3.0T system. The local coil such as a head coil requires less power because it has a smaller volume and achieves the same field strength as a larger body coil. Other significant requirements for the MRI RF power amplifier 20 include the linearity, stability, and efficiency. The linearity is very important to preserve the fidelity of the modulated pulse, since the accuracy of the slice profile depends on it. The amplifier stability contributes to the repeatability of the MRI pulse sequences. The efficiency of the RF power amplifier 20 is important to maintain the cooling requirements, packaging size and cost at practical levels. Class A amplifiers are linear but inefficient. Class B amplifiers are more efficient, but linearity suffers from signal "crossover distortion," which is not acceptable for high-quality MRI applications. In class AB amplifiers, the operating point is adjusted to eliminate the crossover distortion, yet provide higher efficiency. Therefore, class AB amplifiers are commonly used for MRI systems.

Figure 3:
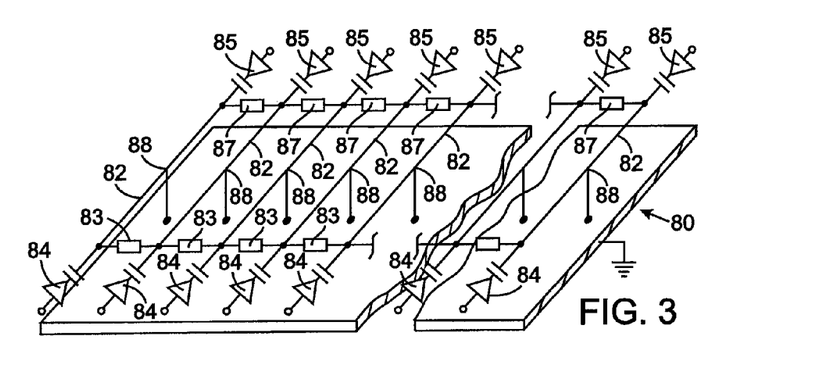
FIG. 3 is a representation of an MRI transmit/receive body coil on which a plurality of Class-E radio frequency amplifiers are located.

The RF power amplifier system according to the present invention utilizes a plurality of novel Class-E amplifiers integrated on the transmit/receive local coil 22 and on a larger transmit/receive body coil. The transmit/receive body coil is located in the scanner 12 shown in FIG. 1 and has a plurality (e.g. sixteen) equally spaced conductive rungs arranged cylindrically. Each rung is a series resonator at the Larmor frequency of the MRI system. The details of the exemplary MRI transmit/receive body coil 80 are depicted in FIG. 3 in which for ease of illustration the cylinder of the coil has been slit longitudinally and laid flat. The ends of each rung 82 are fed by separate amplifiers 84 and 85, which are π radians out of phase from one another, are connected to a ground surface 86 inside the coil cylinder. The mid-point 88 of every rung 82 is directly connected to the ground surface 86. Therefore, unlike prior MRI systems, the amplifiers 84 and 85 that collectively form the RF amplifier are distributed on the transmit/receive body coil 80. The two sections on opposites sides of the mid-point 88 of each rung is decoupled from the adjacent rungs by separate isolation networks 83 and 87. Each isolation network 83 and 87 provides the opposite impedance to the coupling inductance factor M and may simply be a capacitor.

Figure 4:
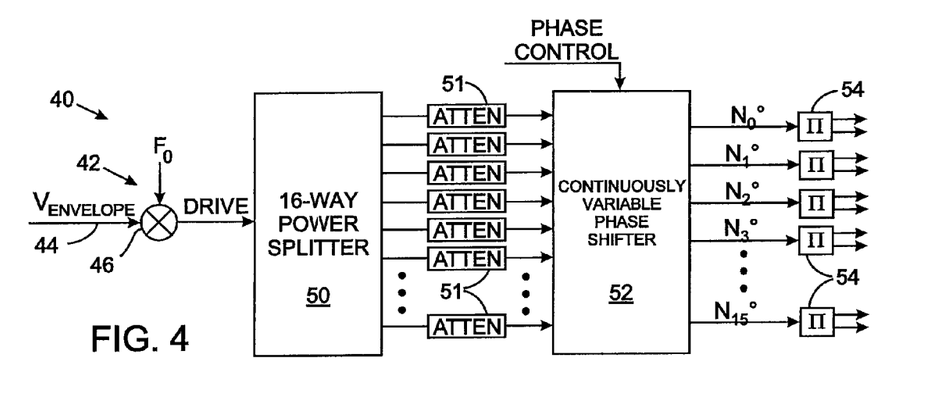
FIG. 4 is a block diagram of a first circuit that produces signals for driving the plurality of Class-E amplifiers on the transmit/receive body coil in FIG. 3.
Figure 5:
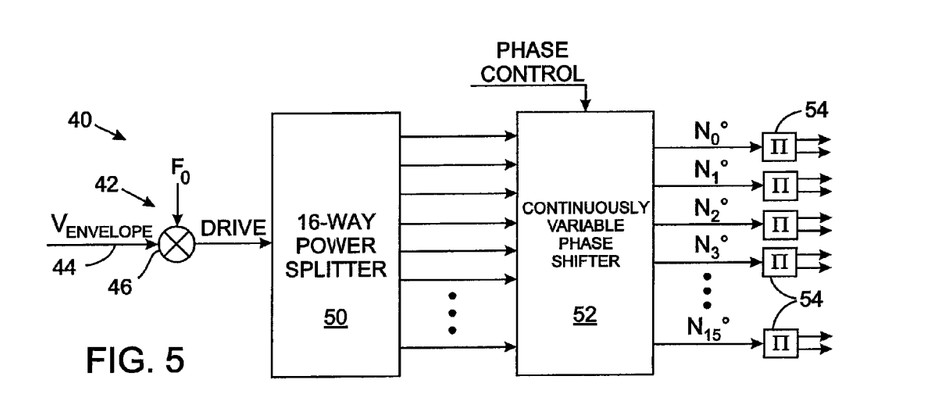
FIG. 5 is a block diagram of a second circuit that produces signals for driving the plurality of Class-E amplifiers on the transmit/receive body coil.

With additional reference to FIG. 4, the signals for driving the coil rung amplifiers 84 and 85 are produced by a distribution circuit 40 that comprises a 16-way power splitter 50, a set of individually variable attenuators 51, a continuously variable phase shifter 52, and a set of 0/180 degree phase splitters 54. FIG. 5 depicts a similar distribution circuit 41 which does not include variable attenuators 51.

The coil rung amplifiers 84 and 85 are driven by pulse width modulated (PWM) signal and for linear applications, the PWM frequency is selected in conformity with the maximum bandwidth and phase linearity desired in the output signal. The exciter 16 (FIG. 1) generates an envelope voltage, designated $V_{ENVELOPE}$, on input line 44. This voltage defines the intensity of the RF energy to be applied to the transmit/receive body coil 80 during the transmit period. The envelope voltage maintains a predefined constant power output via PWM control. The input to the amplifier section is a fixed amplitude signal, which is time sampled, wherein the pulse width modulation is accomplished by switching the carrier signal on and off in proportion to the PWM duty cycle indicated by the filtered feedback signal.

In one embodiment, the input signal is varied and the modulation is achieved by digitizing an analog waveform. The bandwidth of the analog waveform should be at least one half of the PWM frequency, and may need to be significantly lower depending on the maximum allowable phase variance. The digitized waveform is expressed by pulses that vary in duration. Now a setpoint for a preset output (e.g. 30%) is digitally modulated to carry the digital representation of an analog signal. For example, if a 25% modulation is allowed, then the output of the amplifier will vary ±25% and results in an output signal duty cycle that varies from 5% to 55%.

Figure 6:
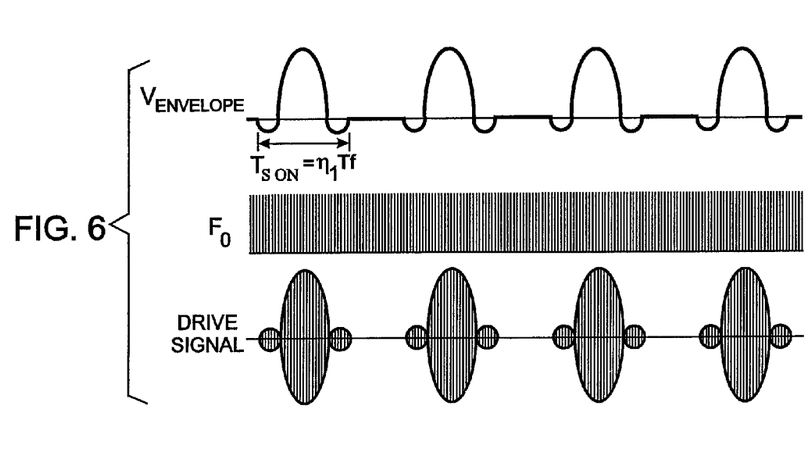
FIG. 6 illustrates waveforms of the signal for driving the Class-E amplifier.

As shown in FIG. 4, an initial section of the distribution circuit 40, designated drive circuit 42, produces a signal depicted in FIG. 6 for driving the coil rung amplifiers. The envelope voltage signal, $V_{ENVELOPE}$, from the exciter 16 is applied to one input of a mixing node 46 that has another input which receives a sinusoidal RF carrier signal $F_0$ from an oscillator (not shown). The $V_{ENVELOPE}$ controls the intensity of the RF signal, based on the parameters specified for the MRI scan. The two input signals combine to form a radio frequency control signal, designated DRIVE, for operating the coil rung amplifiers 84 and 85. The output of each amplifier is a radio frequency excitation signal that has the same waveform as the DRIVE control signal and which is applied to the respective rung 82 of the transmit/receive local coil 22.

Figure 7A:
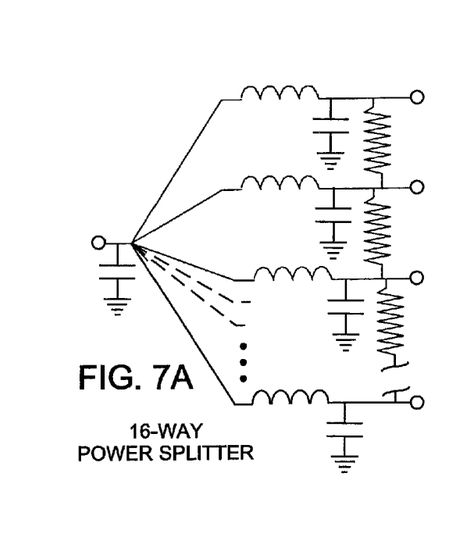
FIGS. 7A, B and C are schematic diagrams of the circuits in the blocks of FIG. 4.
Figure 7B:
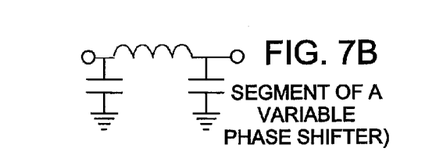

The resultant DRIVE control signal is fed to a sixteen-way power splitter 50 to provide a signal for each rung 82 of the transmit/receive body coil 80. FIG. 7A illustrates a circuit for the 16-way power splitter 50. Each output of the power splitter 50 is passed through a separate variable attenuator 51 which adjusts the amplitude of the individual split signals. In one embodiment, each individual split signal is applied to a continuously variable phase shifter 52, that sets up the required phase differences between the signals going to each rung in the transmit coil, as necessary to create a uniform transmit field. The phase of each split signal is set to a variable $N_0$, $N_1$, $N_2$, $N_3$, . . . , $N_{15}$. As an example, $N_0$ is set to zero degrees, $N_1$ is set to 10 degrees, $N_2$ is set to 30 degrees, and so on. In a special case of emulated homogeneous birdcage mode, the phase shifter may be stepped phase shifter wherein in a 16-channel example, the phases are shifted by steps of 22.5 degrees. In a preferred embodiment, the phase shifter may be a variable phase shifter. FIG. 7B depicts details of the continuously variable phase shifter circuit for one coil rung. This circuit may include a mechanism for independently varying the phase and output signal for each rung. Finally, each rung's RF signal is passed through a 0/180 degree phase splitter 54, such as the type shown in FIG. 7C, to derive the RF signals for driving the two amplifiers 84 and 85 on the respective rung 82. The final stage of each power amplifier section is integrated with the individual rungs as shown in FIG. 3.

Figures 8, 9:
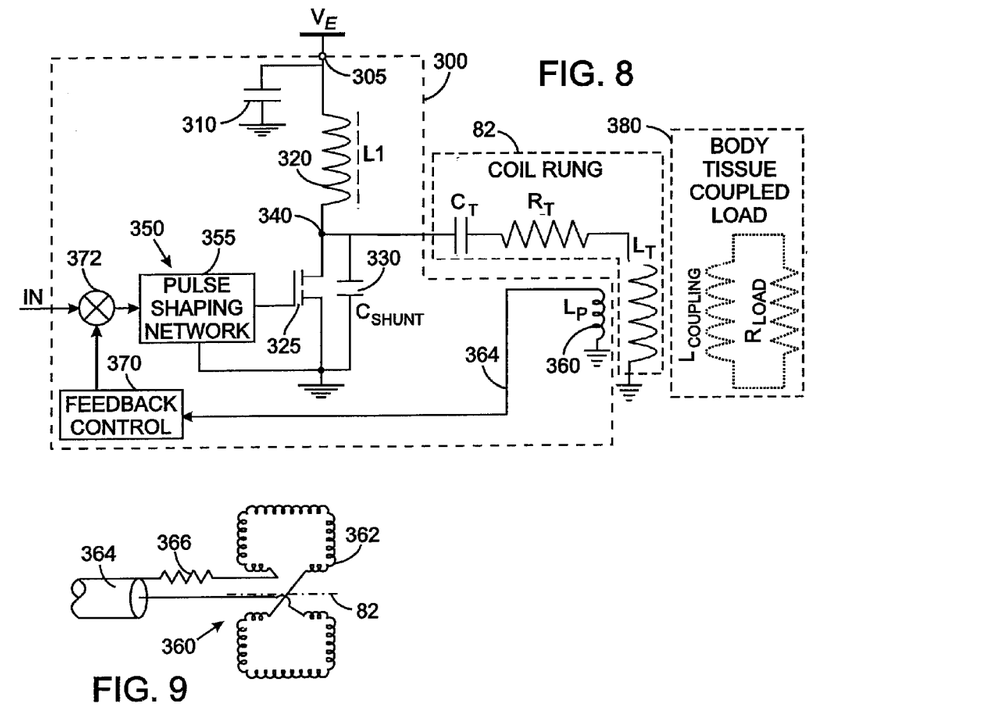
FIG. 8 is a schematic diagram of a Class-E amplifier for an MRI system, according to the present invention.
FIG. 9 illustrates a butterfly type feedback coil straddling a rung of the body coil and connected to the Class-E amplifier in FIG. 8.

Each amplifier 84 and 85 on the rungs 82 of the transmit/receive body coil 80 is a novel Class-E, RF power amplifier 300 shown in FIG. 8. The unique features of this amplifier 300 comprise an overrated switch 325 with low channel resistance and feedback capacitance, a drive circuit 350 closely integrated with the switch, a mechanism to tune components by adjusting the drive frequency and in which the oscillation duty cycle is controlled by non-linearly manipulating a sinusoidal drive signal.

The Class-E, RF power amplifier 300 has a supply terminal 305 connected to a rail voltage $V_E$ and coupled to ground by an input capacitor 310. A choke 320 couples the supply terminal to the switch 325. The choke 320 maintains the current that flows through the switch 325 during its on time, such that after the switch opens, the current flow is distributed between a series resonant rung 82 of the transmit/receive body coil 80 and a shunt capacitor 330. The ratio of this distribution is a function of the phase of the resonant tank circuit's periodic cycle and the switch timing. For maximum efficiency, the switch 325 should close (i.e. make a transition from a non-conductive state to a conductive state) while the voltage across the shunt capacitor 330, and thus the switch 325, is substantially to zero. Preferably, the derivative of that voltage also should be zero.

The switch 325 is a low impedance device, preferably a MOSFET, which is operated by a drive voltage or current determined based on the voltage (E) across or field strength (B) level produced by the series resonant coil rung 82. It is important to use a switch 325 that is over specified by preferably an order of magnitude or more. For example, if the maximum expected current is one ampere, the switch should be rated to handle a transient current of at least ten amperes. The switch element has a low channel resistance and low feedback capacitance. The channel resistance preferably should be such that the product of channel resistance and the peak current is less than 3% of the supply voltage to the circuit. The feedback capacitance preferably should be such that it is less than 10% of the input circuit capacitance.

The drive circuit 350 is closely integrated with the switch 325, wherein the circuit board layout is chosen based on the selected component configuration, for example by mounting the components as close together as possible. In addition, the loop containing the peak current is spatially located in close proximity to the switch 325. In the basic version of the amplifier 300, the respective signal the associated 0/180 degree phase splitter 54 is an input RF signal (IN) that is applied directly to a pulse shaping network 355 in which the mixed signal is AC coupled to a fraction of the sine wave signal and the base line is shifted by a suitable design parameter. The pulse shaping network 355 counteracts parasitic components (e.g. Miller capacitance) of the switch and provide pre-emphasis that properly turns the switch on and off. This non-linearly manipulated signal forms the signal used for driving the gate of the amplifier switch 325.

The series resonant coil rung 82 connects an amplifier output node 340 between the choke 320 and the switch 325 to ground. The series resonant coil rung 82 of the transmit/receive body coil 80, approximates the resonant waveform that is measurable in an inductively coupled load, as represented by the "body tissue coupled load" 380. The majority of the coupling with the body tissue is inductive ($L_{COUPLING}$) and losses associated with that coupling are represented by $R_{LOAD}$.

To maintain the oscillatory condition, it is desirable to have either predictable phase and gain parameters or control over these parameters. When a load is presented, the radio frequency DRIVE control signal is increased to meet a predefined setpoint, or a variable setpoint, alternatively a combination of these two methods. In one implementation, it is sufficient to provide a start condition that initially closes the switch 325 for a limited period of time, followed by providing feedback such that the switch is turned off when sufficient current is detected through the tank circuit.

The period that the amplifier switch 325 is closed is given by $Ts_{ON} = \eta_1 Tf$, where Tf is the total time of on and off periods that form one signal cycle, and $\eta_1$ is the ratio of on time to the total time. Note that $Tf = 1/F_0$. The DRIVE control signal is formed by bursts of higher frequency pulses that are present during the switch on time. These higher frequency pulses provide finer control of the DRIVE control signal without affecting the base frequency $F_0$, as occurred with prior methods. Note that this unique pulse design also makes the design more robust and relatively immune to load variations. Thus it allows tuning of components by slight adjustment of drive frequency and control of the output power of the amplifier 300.

In an optional, more robust implementation, the on-time (or duty cycle) of the Class-E RF power amplifier 300 is varied in response to the output of the transmit/receive body coil 80 and more specifically the section of the rung 82 driven by that amplifier. The RF output of the coil rung 82 as measured by a sensor, such as a pickup coil 360, that preferably is a butterfly-shaped feedback loop 362 shown as in FIG. 9, which senses the radio frequency signal emitted by the associated rung of the body coil. Specifically the butterfly-shaped feedback loop 362 straddles directly over the half of the coil rung 82 driven by the associated amplifier 300 and is connected to a coaxial cable 364 via a 50 ohm resistor 366.

Referring again to FIG. 8, the voltage induced across the butterfly-type pickup coil 360 produces a feedback signal indicating the intensity of the RF excitation signal emitted by the coil rung 82. That feedback signal is rectified and filtered by a sub-circuit 370. The sub-circuit 370 also determines if the voltage from the pickup coil 360 indicates that the actual radio frequency signal emitted by the body coil has the desired intensity. The result of that determination is an error signal that denotes deviation of the actual RF signal intensity from the desired intensity level, which provides a feedback signal that is applied to a node 372 to vary the input RF signal (IN) from the associated 0/180 degree phase splitter 54. The input RF signal is varied until the actual RF signal intensity has the desired intensity level, as indicated by the feedback signal from the pickup coil 360.

The feedback circuit, formed by the pickup coil 360, sub-circuit 370 and mixing node 372, measures the field level generated under load conditions and proportions the amplifier input RF signal IN (on-duration of the amplifiers 300) accordingly to maintain the oscillatory condition.

It should be noted that in a traditional MRI amplifier, multiple sections of amplifiers are used in parallel with a common output transformer to achieve higher power levels. This concept is readily applicable to the Class-E amplifier described in the current invention.

The rate of RF energy deposition is another factor that an RF amplifier design needs to take into account for MRI applications. The rate of energy deposition is usually determined by the specific absorption rate (SAR). A single drive point on a large antenna usually gives rise to large local electric fields, causing federally regulated SAR limits to be exceeded. Multiple drive points around the antenna are used in the present design to limit the SAR. This design will require the application of multiple amplifiers having mutual phase relationships.

Figure 10:
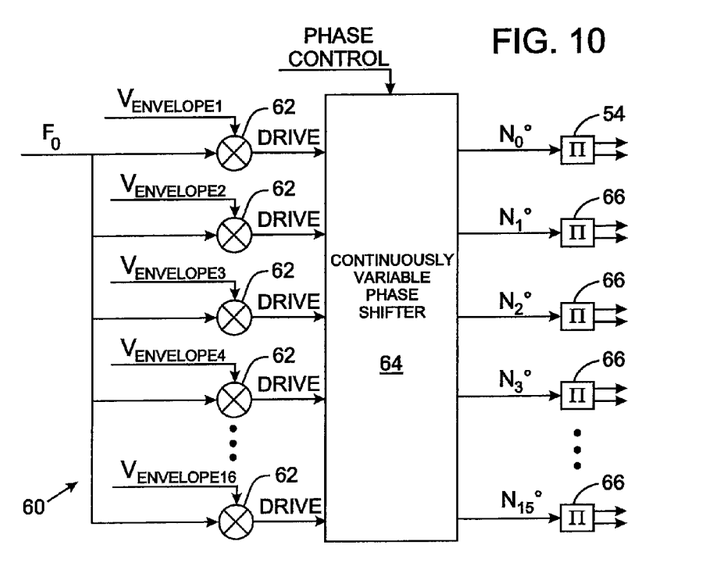
FIG. 10 is a block diagram of a third circuit that produces signals for driving the plurality of Class-E amplifiers on the transmit/receive body coil.

FIG. 10 is a block diagram of parallel distribution circuit 60 for producing signals to drive the plurality of Class-E amplifiers 84 and 85 on a transmit/receive body coil 80. Here each pair of amplifiers for a given rung of the coil is driven by a separately modulated signal and thus parallel distribution circuit 60 has a separate mixing node 62, for each coil rung 82. Each mixing node 62 receives the common RF carrier signal $F_0$ from the exciter 16 and a different envelope voltage signal, $V_{ENVELOPE}$, that defines the amplitude and pulse shape of the DRIVE control signal for the respective coil rung. This enables an asymmetric coil or phased array to be used with the DRIVE control signals being configured to produce a symmetrical field within the patient being imaged. The RF carrier signal $F_0$ and the envelope voltage signal are applied to inputs of a mixing node 46 for the rung circuit. The DRIVE control signal resulting from the combination of those input signals is fed to a continuously variable phase shifter 64, similar to phase shifter 52 previously described.

Figure 7C:
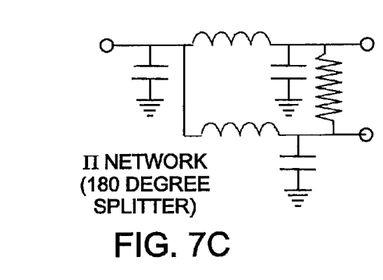

Each rung's signal then is passed through a 0/180 degree phase splitter 66, such as the type shown in FIG. 7C, to derive the signals for driving the two amplifiers 84 and 85 on the respective rung 82.

Instead of using the MRI the transmit/receive body coil 80, the RF signal can be applied to the transmit/receive local coil 22 shown in FIG. 1 that forms a transverse electromagnetic (TEM) transmit array. The details of the transmit/receive local coil 22 are depicted in FIG. 10 and comprise a plurality of rungs 90 arranged cylindrically, e.g. there are eight or sixteen rungs. One end of each rung 90 is connected to circuit ground, while the other end is connected to the output of a Class-E amplifier 92 of the type illustrated in FIG. 8. Because the transmit/receive local coil 22 requires less power than the transmit/receive body coil 80, only one amplifier per rung is used. Each rung is decoupled from the adjacent rungs by an isolation network 91.

Figures 11, 12:
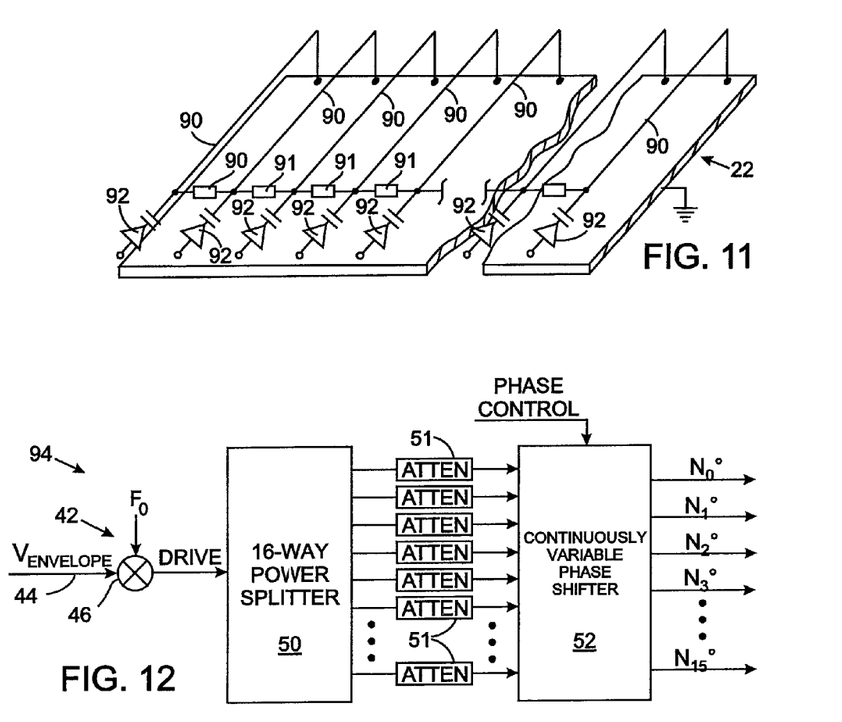
FIG. 11 is a representation of an MRI transmit/receive local coil on which a plurality of Class-E radio frequency amplifiers are located.
FIG. 12 is a block diagram of one circuit that produces signals for driving the plurality of Class-E amplifiers on the transmit/receive local coil in FIG. 11.

With reference to FIG. 11, the Class-E amplifiers 92 are driven by a distribution circuit 94 that is similar to the distribution circuit 40 in FIG. 4, but without the set of 0/180 degree phase splitters 54, as there is only one amplifier per rung in the transmit/receive local coil 22. Like components in both distribution circuits have been assigned identical reference numerals. The latter distribution circuit 94 otherwise functions the same as the previously described one. FIG. 12 depicts a similar distribution circuit 95 which does not include variable attenuators 51.

Figure 13:
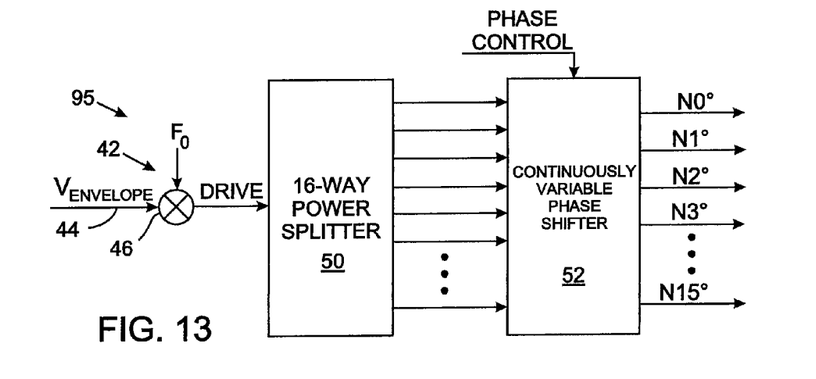
FIG. 13 is a block diagram of another circuit that produces signals for driving the plurality of Class-E amplifiers on the transmit/receive local coil.

FIG. 13 illustrates a parallel distribution circuit 96 for producing signals to drive the Class-E amplifiers 92 on the transmit/receive local coil 22 in FIG. 10. The parallel distribution circuit 96 functions in an equivalent manner to the parallel distribution circuit 60 in FIG. 9 except for lacking the 0/180 degree phase splitters 66.

Figure 14:
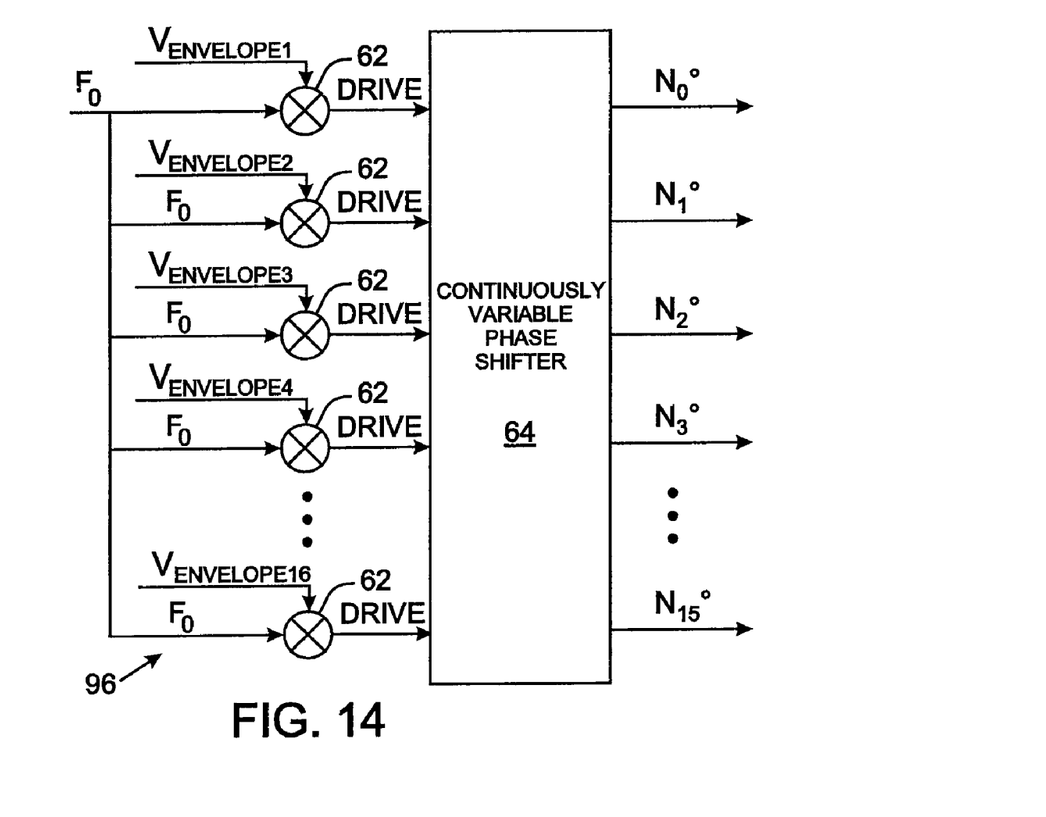
FIG. 14 is a block diagram of a further circuit that produces signals for driving the plurality of Class-E amplifiers on the transmit/receive local coil.
Figure 15:
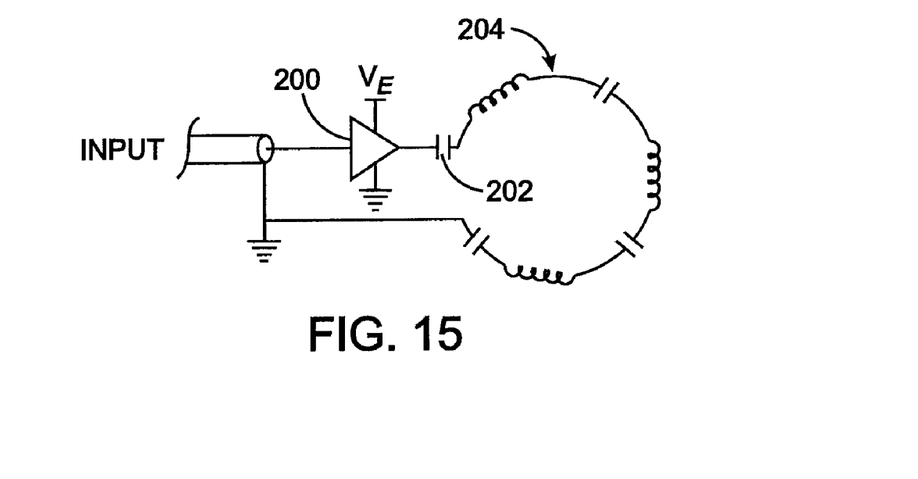
FIG. 15 illustrates a coil system for NMR spectroscopy which employs a Class-E amplifier according to the present invention.

FIG. 14 illustrates application of the present Class-E amplifier to NMR spectroscopy which is another form of a magnetic resonance imaging. Here the excitation signal is applied as an input signal to the Class-E amplifier 200 that has an output coupled by a capacitor 202 to a single loop transmit coil 204. The single loop transmit coil 204 has distributed capacitance and inductance. This configuration is applicable in NMR spectroscopy for studying phosphorus ($^{31}P$), carbon ($^{13}C$), sodium ($^{23}Na$) or other nuclei.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

The invention claimed is:

1. A radio frequency section for a magnetic resonance imaging system that transmits a radio frequency excitation signal into an object being imaged, the radio frequency section comprising:
    a transmit coil for placement around the object;
    a drive circuit which produces a radio frequency control signal; and
    a Class-E amplifier that in response to the radio frequency control signal produces the radio frequency excitation signal which is applied to the transmit coil, wherein the Class-E amplifier includes a sensor that detects the radio frequency excitation signal emitted from the transmit coil and produces a feedback signal which controls production of the radio frequency excitation signal.

2. The radio frequency section as recited in claim 1 wherein the Class-E amplifier comprises an element at which the radio frequency control signal is altered in response to the feedback signal.

3. The radio frequency section as recited in claim 1 wherein the Class-E amplifier comprises a sub-circuit that filters the feedback signal to provide a filtered feedback signal; and an element at which the radio frequency control signal is altered in response to the filtered feedback signal.

4. The radio frequency section as recited in claim 3 wherein the sub-circuit comprises an RC network.

5. The radio frequency section as recited in claim 3 wherein the sub-circuit also rectifies the feedback signal.

6. The radio frequency section as recited in claim 1 the Class-E amplifier comprises a choke and a switch connected in series between a supply voltage source and circuit ground with an amplifier output node formed between choke and the switch, wherein the transmit coil is connected to the amplifier output node.

7. The radio frequency section as recited in claim 6 wherein the Class-E amplifier further comprises a shunt capacitor connected in parallel with the switch.

8. The radio frequency section as recited in claim 6 wherein the Class-E amplifier further comprises a shunt capacitor coupling the amplifier output node to the circuit ground.

9. The radio frequency section as recited in claim 6 wherein the Class-E amplifier further comprises an input capacitor connected between the supply voltage source and the circuit ground.

10. The radio frequency section as recited in claim 1 wherein the drive circuit modulates a radio frequency carrier signal to produce the radio frequency control signal.

11. The radio frequency section as recited in claim 10 wherein the radio frequency control signal has an envelope that is modulated.

12. The radio frequency section as recited in claim 1 wherein the transmit coil is a transverse electromagnetic transmit array having a plurality of rungs, and a separate Class-E amplifier is connected to drive each rung.

13. The radio frequency section as recited in claim 12 wherein the sensor is a butterfly-shaped feedback loop that straddles one of the plurality of rungs.

14. A radio frequency section for a magnetic resonance imaging system that transmits a radio frequency excitation signal into an object being imaged, the radio frequency section comprising:
    a transmit coil having a plurality of rungs;
    an exciter which produces a radio frequency carrier signal;
    a distribution circuit that receives the radio frequency carrier signal and an envelope signal designating a desired intensity level for the radio frequency excitation signal and in response thereto produces a radio frequency control signal, the distribution circuit comprising a power splitter that divides the radio frequency control signal into a plurality of sub-drive signals, one of which for each rung of the transmit coil; and
    a first plurality of Class-E amplifiers, each one having a first pickup coil that produces a given first feedback signal indicating an intensity of a radio frequency signal emitted from the transmit coil, and each of the first plurality of Class-E amplifiers responding to one of the sub-drive signals and the given first feedback signal by producing a radio frequency excitation signal that is applied to one of the plurality of rungs of the transmit coil.

15. The radio frequency section as recited in claim 14 wherein each of the first plurality of Class-E amplifiers comprises a first element which alters the one sub-drive signal in response to the given first feedback signal.

16. The radio frequency section as recited in claim 14 wherein each of the first plurality of Class-E amplifiers comprises a first sub-circuit that rectifies the given first feedback signal to provide a rectified feedback signal; and a first element which alters the one sub-drive signal in response to the rectified feedback signal.

17. The radio frequency section as recited in claim 14 each of the first plurality of Class-E amplifiers comprises a choke and a switch connected in series between a supply voltage source and circuit ground with an amplifier output node formed between choke and the switch, wherein the transmit coil is connected to the amplifier output node.

18. The radio frequency section as recited in claim 17 wherein each of the first plurality of Class-E amplifiers further comprises a shunt capacitor connected in parallel with the switch.

19. The radio frequency section as recited in claim 14:
wherein each of the first plurality of Class-E amplifiers is connected to a first section of each of the plurality of rungs of the transmit coil; and
further comprising a second plurality of Class-E amplifiers, each one having a second pickup coil producing a given second feedback signal that indicates an intensity of a radio frequency signal emitted from the transmit coil, and each of the second plurality of Class-E amplifiers responds to another one of the sub-drive signals and the given second feedback signal by producing a second radio frequency excitation signal that is applied to a second section of one of the plurality of rungs of the transmit coil.

20. The radio frequency section as recited in claim 19 wherein each of the first and second pickup coils is a butterfly-shaped feedback loop that straddles a rung of the transmit coil.

21. The radio frequency section as recited in claim 14 wherein each first pickup coil is a butterfly-shaped feedback loop that straddles a rung of the transmit coil.

\* \* \* \* \*